United States Patent [19]

Kundinger et al.

[11] Patent Number: 4,705,720

[45] Date of Patent: Nov. 10, 1987

[54] FLEXIBLE MULTI-LAYER POLYIMIDE LAMINATES

[75] Inventors: Ernst F. Kundinger, Breuberg/Neustadt; Erich Klimesch, Erlenbach; Hans-Georg Zengel, Kleinwallstadt, all of Fed. Rep. of Germany; Jeffery D. Lasher, Tolland, Conn.

[73] Assignee: Akzo NV, Arnhem, Netherlands

[21] Appl. No.: 41,088

[22] Filed: Apr. 22, 1987

Related U.S. Application Data

[62] Division of Ser. No. 832,582, Feb. 24, 1986.

[30] Foreign Application Priority Data

Feb. 25, 1985 [DE] Fed. Rep. of Germany ....... 3506524

[51] Int. Cl.$^4$ .......................... B32B 15/00; B05D 3/02
[52] U.S. Cl. .................................. 428/332; 427/208.4; 427/208.8; 427/289; 427/307; 427/309; 427/358; 427/407.1; 427/409; 427/410; 427/412; 428/349; 428/379; 428/383; 428/421; 428/473.5; 528/351
[58] Field of Search ............... 428/349, 332, 421, 379, 428/383; 427/410, 412, 358, 289, 307, 309, 407.1, 409, 208.4, 208.8; 528/351; 156/308.2, 244.11, 153

[56] References Cited

U.S. PATENT DOCUMENTS

| | | | |
|---|---|---|---|
| 3,179,614 | 4/1965 | Edwards | 260/78 |
| 3,179,634 | 4/1965 | Edwards | 260/30.2 |
| 3,264,250 | 8/1966 | Gall | 260/32.6 |
| 3,822,175 | 7/1974 | Yuan | 428/473.5 |
| 3,900,662 | 8/1975 | Yuan | 428/473.5 |
| 3,981,847 | 9/1976 | Meyer | 528/351 |
| 3,995,293 | 11/1976 | Numata et al. | 354/202 |
| 4,075,420 | 2/1978 | Walton | 174/117 F |
| 4,238,538 | 12/1980 | Manwiller | 428/36 |
| 4,508,766 | 4/1985 | Inaike et al. | 427/388.1 |
| 4,522,880 | 6/1985 | Klostermeier et al. | 428/322 |
| 4,543,295 | 9/1985 | St. Clair et al. | 428/322 |
| 4,562,119 | 12/1985 | Darms et al. | 428/458 |
| 4,576,857 | 3/1986 | Gannett et al. | 428/26 |
| 4,590,258 | 5/1986 | Linde et al. | 428/322 |

FOREIGN PATENT DOCUMENTS

| | | |
|---|---|---|
| 0048315 | 5/1981 | European Pat. Off. |
| 0116297 | 1/1983 | European Pat. Off. |
| 300086 | 7/1972 | Fed. Rep. of Germany |
| 2441101 | 12/1984 | Fed. Rep. of Germany |
| 0004374 | 3/1979 | Japan |
| 60067539 | 9/1983 | Japan |
| 1317321 | 4/1970 | United Kingdom |

OTHER PUBLICATIONS

Spektrum der Wissenschaft, Jun. 1980, "Metallische Glaser", Von Praveen Chaudhari Bill C. Giessen and David Turnbull, pp. 46–61.

"Chemistry and Industry", Jul. 1969, pp. 934 to 939: *Perfluoroalkylene-Linked Aromatic Polymers,* by J. P. Critchley, V. C. R. McLoughlin, J. Thrower and I. M. White.

Handbook of Adhesives, 2nd Edition, Irving Skeist, pp. 597–618.

*Primary Examiner*—Edith Buffalow
*Attorney, Agent, or Firm*—Parkhurst & Oliff

[57] ABSTRACT

A multilayer laminate having at least one layer of a no longer formable fully aromatic polyimide and at least one layer of substrate material, the layer of no longer formable polyimide adhering directly on one side to the layer of substrate material with a peel strength of at least 4.0 N.cm. The layer of no longer also formable polyimide is also insoluble in phenolic solvents, has a tensile strength of from 100 to 150 N.mm$^2$, a breaking elongation of from 15 to 100%, a dielectric dissipation factor of from $1.5 \times 10^{-3}$ at 1 Khz. Additionally, a layer of heat-sealable high-temperature adhesive selected from the class of polyacrylates, polysulfone resins, epoxy resins, fluoropolymer resins, silicone resins or butyl rubbers is joined to that side of the polyimide layer which is remote from the substrate material.

19 Claims, 2 Drawing Figures

FLEXIBLE MULTI-LAYER POLYIMIDE LAMINATES

This is a division of application Ser. No. 832,582 filed Feb. 24, 1986.

BACKGROUND OF THE INVENTION

The invention relates to flexible multilayer laminates comprising at least one layer of a no longer formable, fully aromatic polyimide and at least one layer of a substrate material. The invention also relates to a process for producing these laminates.

Laminates comprising one or more layers of polyimide and one or more layers of substrate material may be used for a variety of applications, such as, for example, reinforcing materials. In addition, laminates of the type in question, in the form of polyimide-coated metal foils, are used for printed electrical circuits. In that case, use is made of the flexibility and outstanding mechanical, thermal and electrical properties of the polyimides. This is because the laminates are frequently exposed to high temperatures during further processing, for example during soldering or drilling. The laminates also have to satisfy stringent requirements regarding their electrical and mechanical properties.

Laminates comprising only one substrate layer of metal or a metal alloy and a layer of polyimide, so-called single clads, may be used for printed electrical circuits. The same applies to multilayer laminates, so-called double clads or multiclads, which comprise several metal layers and/or several polyimide layers. In certain cases, however, multilayer laminates are superior to single clads. In the case of printed circuits for example, it is often necessary to make printed conductor lines which intersect one another. The high packing densities often required, i.e. overall layer thicknesses, cannot be obtained where single clads are used, but only where double clads or multiclads are used. The present invention is concerned with multilayer laminates which are eminently suitable for the production of double clads and multiclads. In the context of the invention, double clads are understood to be laminates comprising two (metallic) substrate layers, while multiclads are understood to be laminates comprising more than two (metallic) substrate layers.

Laminates containing polyimides and substrate materials are known. In this case, the polyimide layers are often bonded to the substrate materials by a conventional adhesive. For example, U.S. Pat. No. 3,900,662 describes the bonding of polyimide to metal by an acrylate-based adhesive. Use is also made of this possibility in the laminates described in U.S. Pat. No. 3,882,175.

If double clads or multiclads are produced in accordance with the above-mentioned patent specifications in which a layer of an acrylate adhesive is situated between each metal layer and each polyimide layer, the products obtained have a number of disadvantages, namely:

(a) The overall layer thickness of the clads is considerable on account of the necessary adhesive layers, whereas low overall layer thicknesses are required for multiclads.

(b) The metal (substrate material) layer is directly joined to acrylate which is inferior to the polyimide in its dimensional stability under heat. Thus, undesirable decomposition of the acrylate often occurs during preparation of the clads for printed circuits. This decomposition occurs with the acrylate layer at the high temperatures which the metal layer encounters, for example during soldering and drilling. Since the acrylate is directly joined to the metal layer, it is not adequately protected against those temperatures.

(c) Since the acrylate has poorer electrical insulating properties than the polyimide, the adhesive layer(s) between the polyimide and substrate material (metal) adversely affect(s) the dielectric properties.

It has been found that, where conventional adhesives, such as those based on acrylate, epoxide, polyamide, phenolic resin, etc. are used, the laminates in which the polyimide is bonded to the metal by an intermediate layer of one of these adhesives do not show entirely satisfactory properties which meet the stringent demands often imposed.

On account of the disadvantages of laminates comprising layers of conventional adhesives between polyimide and metal, multilayer laminates have been proposed wherein the polyimide is bonded directly to metal, i.e. without a layer of adhesive. For example, DE-OS No. 32 15 944 describes laminates in which two metal layers are bonded by an intermediate layer of polyimide. The polyimide used in this case predominantly consists of diphenyl tetracarboxylic acid and may be bonded to a metal foil by applying high temperature and pressure. In other words, the polyimide is formable. It has now been discovered that formable polyimides or polyimides which are soluble in phenolic solvents are inferior in their thermal stability to fully aromatic, no longer formable polyimides which are insoluble in phenolic solvents. In double clads which only contain these formable polyimides as an insulating layer(s) the polyimide may flow away in the process of laminating, resulting in an undesirable direct contact between the metal layers. Accordingly, clads containing only formable polyimides are inferior to products containing no longer formable polyimides as an insulating layer(s).

Because of the disadvantages associated with clads containing a layer of adhesive between metal and polyimide, single clads of a substrate material to which a no longer formable, fully aromatic polyimide which is insoluble in phenolic solvents is directly bonded have already been proposed. These single clads show excellent mechanical, thermal and electrical properties.

Starting out from these single clads, it would be desirable to produce multilayer laminates which like their single clad counterparts consist only of substrate materials and these no longer formable, fully aromatic polyimides and which would thus show the same mechanical, thermal and electrical properties. However, it has been found that two or more single clads of this type cannot be directly bonded to one another or one single clad directly bonded to a metallic substrate material, i.e. without an intermediate layer of adhesive, because it is not possible to apply another layer of substrate material or another single clad to the fully hardened polyimide layer without a coupling layer sufficient to impart a high peel strength, i.e. high adhesion between the polyimide and the additional layer. Although application of the other layer of substrate material before the polyimide has completely hardened is possible in principle and leads to an increase in peel strength, bubbles can be formed in the polyimide layer because volatile constituents such as, for example, water have to escape during its hardening and the release of these volatile constituents can be impeded by the additional layer of substrate material.

SUMMARY OF THE INVENTION

It has now surprisingly been found that the disadvantages attending known multilayer laminates can be overcome by laminates comprising at least one layer of a no longer formable fully aromatic polyimide and at least one layer of substrate material, wherein the layer of no longer formable polyimide adheres directly on one side to the layer of substrate material with a peel strength of at least 4.0 N/cm, is insoluble in phenolic solvents, has a tensile strength of from 100 to 150 N/mm$^2$, a breaking elongation of from 15 to 100%, a dielectric dissipation factor of from $1.5 \times 10^{-3}$ to $5 \times 10^{-3}$ at 1 kHz. Furthermore, a layer of heat-sealable high-temperature adhesive selected from the class of polyacrylates, polysulfone resins, epoxy resins, fluoropolymer resins, silicone resins or butyl rubbers is joined to that side of the polyimide layer which is remote from the substrate material.

In these laminates, the high-temperature adhesive, which is inferior in its thermal and electrical (insulating) properties to the no longer formable polyimide, is not joined to the substrate material (metal). On the one hand, it is protected by the polyimide layer against the high temperatures which can arise during further processing of the metal surface. On the other hand, it was surprisingly found that the dielectric properties of the laminates can also be improved if there is a layer of polyimide between the metal layer and the adhesive layer. For example, when polyacrylates for example are used for the adhesive layer, the dielectric (insulating) properties of the laminates according to the invention are distinctly better than might be estimated from the sum of the dielectric properties of the individual products. This is shown very clearly, for example, in a preferred embodiment of the invention in which two layers of polyimide (each directly joined on one side to substrate material) are bonded to one another by a layer of adhesive. These double clads show dielectric properties which come very close to those of laminates (for example single clads) containing only substrate material and polyimide. Surprisingly, the poorer dielectric properties of polyacrylates have very little effect on the product of the invention, in complete contrast to products in which polyacrylate is directly joined to substrate material (metal). It is assumed that the "embedding" of the acrylate layer between two polyimide layers is responsible for this.

In addition, the number of necessary adhesive layers in the laminates according to the invention and in the double clads or multiclads containing the basic element of the laminates according to the invention is reduced by comparison with products containing a layer of adhesive between each polyimide layer and each layer of substrate material. This increases the relative amount of polyimide present in the insulating layers and hence the thermal stability, improves the dielectric properties and provides for lower overall layer thicknesses of the double clads and multiclads.

DETAILED DESCRIPTION OF THE PREFERRED EMBODIMENTS

Figure 1:
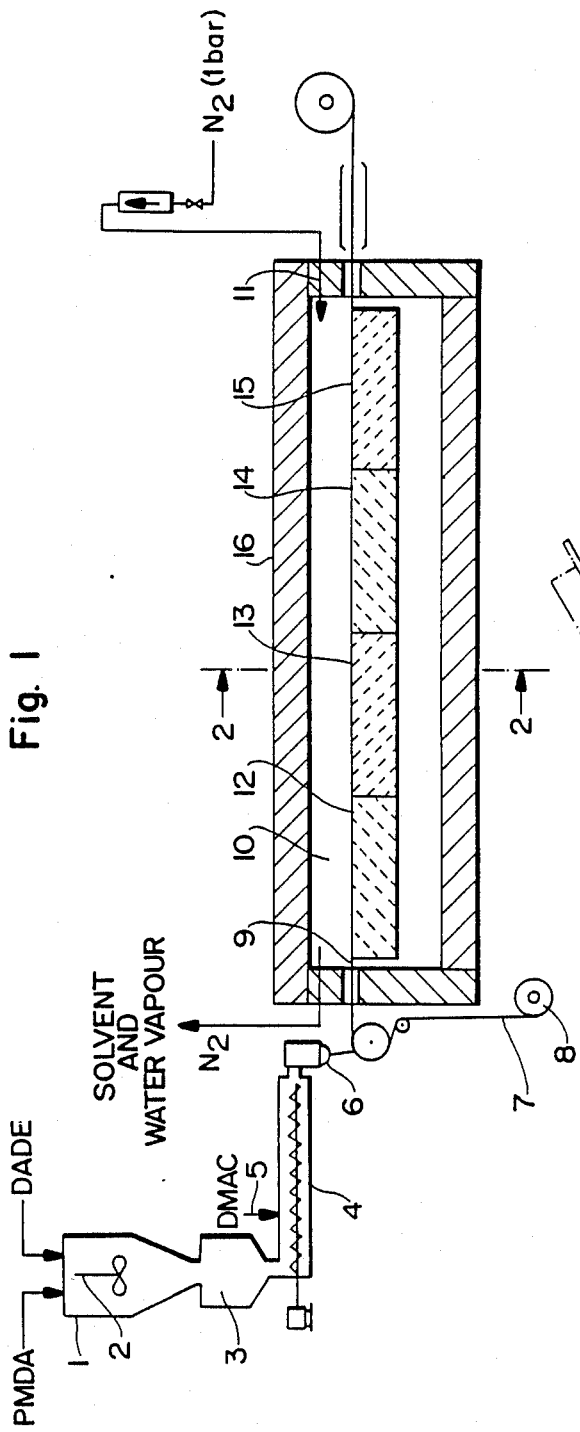
FIG. 1 is a diagrammatic illustration of a preferred Apparatus for carrying out the first step of the process according to the invention.

Accordingly, the laminates according to the invention comprise at least one layer of no longer formable polyimide which, on one of its sides, adheres directly, i.e. without an intermediate layer, to a layer of substrate material. The basic element of no longer formable polyimide and substrate material has a peel strength of at least 4.0 N/cm, as measured by the method described in IPC TM 650, 2.4.9. The other side or surface of the no longer formable polyimide is covered by a layer of a heat-sealable high-temperature adhesive. Accordingly, the laminates according to the invention contain at least one element which forms the basis of the laminates and which has the following construction: substrate material/no longer formable polyimide/heat-sealable high-temperature adhesive.

The layer of no longer formable polyimide has a tensile strength of from 100 to 150 N/mm$^2$, as measured in accordance with ASTM D 882, a breaking elongation of from 15 to 100%, as measured in accordance with ASTM D 882 and a dielectric dissipation factor of from $1.5 \times 10^{-3}$ to $5 \times 10^{-3}$ at 1 kHz, as measured in accordance with ASTM D 150.

In the context of the invention, "fully aromatic, no longer formable polyimides and insoluble in phenolic solvents" are understood to be polyimides which are obtained from aromatic tetracarboxylic acids or their dianhydrides and primary aromatic diamines, each of the carboxyl groups and the primary amino groups being directly attached to an aromatic ring. In addition, the polyimides cannot be melted without decomposition and are insoluble in conventional solvents, including phenolic solvents, such as phenol, cresols and halogenated phenols. Accordingly, these polyimides cannot be formed again by melting or by dissolving.

Double clads and multiclads may be produced advantageously from the laminates according to the invention, comprising the basic element of a substrate material/no longer formable polyimide/heat-sealable high-temperature adhesive. Thus, the following products inter alia may be obtained with excellent electrical, mechanical and thermal properties from these laminates all of which contain the above-described basic element:

(a) double clads comprising substrate material/no longer formable polyimide/heat-sealable high-temperature adhesive/no longer formable polyimide/substrate material.

(b) double clads comprising substrate material/no longer formable polyimide/heat-sealable high-temperature adhesive/heat-sealable high-temperature adhesive/no longer formable polyimide/substrate material.

(c) multiclads in which the outer surface of one or both layer(s) of substrate material of the laminates (a) or (b) is directly joined to no longer formable polyimide. The outer surface of the substrate layer of the basic element (consisting of substrate material/no longer formable polyimide/heat-sealable high-temperature adhesive) may also be directly joined to a layer of no longer formable polyimide. Accordingly, the products contain at least one layer of substrate material which is joined on either side to a layer of no longer formable polyimide.

The laminates (a) to (c) are preferred embodiments of the laminates according to the invention. Their production is described hereinafter.

Products (a) and (b) differ from one another in the fact that, in one case, there is only one layer of heat-sealable high-temperature adhesive and, in the other case, two layers. These two layers of heat-sealable high temperature adhesive may merge with one another to a greater or lesser extent. In products (a) and (b), both layers of no longer formable polyimide and both layers of substrate material may each have the same or different chemical structure and/or layer thickness. In the case of product (b), this also applies to the two layers of heat-sealable high-temperature adhesive.

Accordingly, in products (a) and (b), two layers of no longer formable polyimides (both directly joined on one side to substrate material) are joined to one another by heat-sealable high-temperature adhesive on that side remote from the substrate material. They all comprise the basic element of the laminates according to the invention. The assembly of two such (identical or different elements at the layer of heat-sealable high-temperature adhesive gives the products mentioned in (b). The products mentioned in (a) are formed for example when two of the basic elements are joined together in such a way that the two originally separated layers of heat-sealable high-temperature adhesive merge into one another, forming a single, defined layer in the end product.

Since, the laminates according to the present invention may be used for printed circuits, metals or alloys are used as the substrate materials and since high temperatures are applied during further processing of the laminates, it is thus advantageous that the basic element of the laminates according to the invention and of the double clads and multiclads containing same, have the heat-sealable high-temperature adhesive joined to the no longer formable polyimide and not to the metal. Accordingly, the heat-sealable high-temperature adhesive which is less stable under heat is protected by the more stable polyimide because the high temperatures are generated at the metal layer, such as, for example, during soldering. By virtue of the fact that layers of substrate material, such as, for example metal, directly joined on one or both sides to no longer formable polyimides are present in the basic element of the laminates according to the invention, the number of adhesive layers required is reduced to a minimum. This is of considerable significance because the thermal stability of the products can be increased and their overall layer thickness reduced in this way.

As mentioned above it is advantageous for one or both layer(s) of substrate material to be joined on either side to a layer of fully aromatic, no longer formable polyimide. In this way, it is possible to obtain multiclads which provide for a high packing density, even in complex printed circuit boards. In this case, other layers, including layers of materials other than polyimides, may be present on one or both outer surface(s), which now consist(s) of no longer formable polyimides, providing this is compatible with the application envisaged.

Preferable no longer formable fully aromatic polyimides have the following recurring structure:

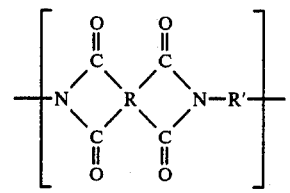

wherein R is a tetrafunctional aromatic group and R' is a difunctional aromatic group. More specifically, R represents:

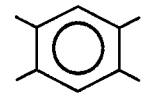

and R' represents

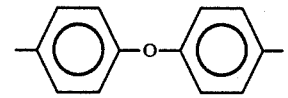

These polyimides may be obtained by reaction of tetracarboxylic acids or their mono- or di-anhydrides with diamines. Examples of suitable dianhydrides are pyromellitic acid dianhydride, 2,3,6,7-naphthalene tetra-carboxylic acid dianhydride, 3,4,3',4'--diphenyl sulfone tetracarboxylic acid dianhydride, perylene-3,4,9,10-tetra-carboxylic acid dianhydride, 3,4,3',4'-diphenyl ether tetracarboxylic acid dianhydride.

Examples of diamines which may be reacted with the tetracarboxylic acids or their derivatives to give suitable, no longer formable, fully aromatic polyimides are 4,4'-diaminodiphenyl ether, 5-amino-2-(p-aminophenyl)-benzothiazole, 4-amino-2-(p-aminophenyl)-benzothiazole, 5-amino-2-(m-amino-phenyl)-benzothiazole, 5-amino-2-(p-aminophenyl)-benzoxazole, 4-amino-2-(m-aminophenyl)-benzothiazole, p- and m-phenylene diamine, 4,4'-diaminodiphenyl, bis-(4-aminophenyl)-methane, 4amino-2-(p-aminophenyl)-benzoxazole, 4-amino-2-(m-aminophenyl)-benzoxazole, 5-amino-2-(m-aminophenyl)-benzoxazole, 2,5-diaminobenzoxazole, 2,5-diaminobenzothiazole.

The polyimide obtainable by reaction of pyromellitic acid dianhydride (PMDA) with 4,4'-diaminodiphenyl ether (DADE) has proven to be particularly suitable.

The laminates according to the invention contain layer(s) of heat-sealable high-temperature adhesive. This adhesive is selected from the class of polyacrylates, polysulfone resins, epoxy resins, fluoropolymer resins, silicone resins or butyl rubbers.

According to the invention, heat-sealable high-temperature adhesives are understood to be products of the abovementioned types which are formable at a temperature in the range from 140° to 500° C., optionally under pressure, and at the same time have a bonding effect. In addition, they should not melt at temperatures below 200° C. However, the products used as high-temperature adhesives do not necessarily have to show a defined melting point or melting range. It is sufficient if they can be formed without melting at a temperature in the above-mentioned range. As already mentioned, the high-temperature adhesives must have a bonding effect.

This means that a laminate of polyimide and adhesive produced as described below must show a peel strength, as measured by the method described in IPC TM 650, 2.4.9, of at least 2.0 N/cm. The laminate used for this test is produced as follows:

A single clad of metal and polyimide is produced by one of the methods described in Examples 1 to 3. The adhesive to be tested is applied to the polyimide layer of this single clad in the form of a solution or film; if the adhesive is applied as a solution, the solvent is removed by heating. The adhesive is then heat-sealed at a temperature of from 140° to 500° C., optionally under pressure. The suitable temperature and pressure conditions depend upon the nature of the adhesive and may be determined by simple tests. After removal of the metal layer, for example by etching, the peel strength may be determined. Products which do not have a peel strength of at least 2.0 N/cm over the above-mentioned temperature range, even where pressure is applied, are unsuitable as adhesives for the laminates according to the invention.

The requirement that the adhesives should be heat-sealable, i.e. formable, at a temperature of from 140° to 500° C. does not mean that all adhesives which satisfy this requirement are suitable for every application of the laminates according to the invention. On the contrary, adhesives which can only be formed at 250° C. or higher may have to be used for a specific application.

The basic element of polyimide and adhesive in the laminates according to the invention advantageously has a peel strength of more than 4.0 N/cm.

The thickness of the layer(s) of no longer formable polyimide, which perform(s) an insulating function, for example where the laminates are used for printed circuits, may be varied within wide limits. This is because the preferred processes for producing the laminates according to the invention, which are described hereinafter also make it possible to produce laminates comprising relatively thick layers of these polyimides which satisfy the stringent demands imposed on these laminates. The thickness of each layer of no longer formable polyimide is preferably between 1 μm and 1 mm. Where the laminates according to the invention are used for standard printed circuits in the electronics field, layer thicknesses for the no longer formable polyimides of from 10 μm to 1 mm and preferably from 50 μm to 250 μm have proved to be particularly suitable.

In another preferred embodiment, all the layers of no longer formable polyimide (providing there is more than one layer) have the same thickness. This is the case inter alia when the laminates in question are multilayer laminates produced from identical single clads of the same quality.

In one preferred embodiment of the laminates, a foil of a metal or a metal alloy and/or a polymer film and/or a sheet-form fibrous material is/are used as the substrate material.

Suitable polymer films are, for example, films of aromatic polyamides or polyimides. Suitable fibers for the sheet-form material are metal fibers, synthetic fibers, for example of aromatic polyamides, and mineral fibers, such as glass fibers quartz fibers or asbestos fibers or carbon fibers.

Particularly preferred substrate materials, especially where the laminates are used for printed circuit boards are foils of copper, nickel, aluminium, or foils of an alloy containing one or more of these metals as an essential constituent, for example a chrome/nickel alloy. Foils of steel have also proven to be very suitable. In one special embodiment, the substrate material is a foil of rolled, tempered copper or a rolled, tempered copper alloy. In another preferred embodiment of the process according to the invention, a foil of amorphous metal is used as the substrate material. Special properties of the laminates may be obtained in this way, being produced by the amorphous metals. These amorphous metals do not have the crystal structures typical of metals. Because of this, they are also known as "metallic glasses". They may be produced by quenching metal melts or melts of alloys. Amorphous metals suitable as substrate material for the laminates according to the invention are, for example, amorphous alloys containing iron. Other suitable amorphous metals are described in the Article in "Spektrum der Wissenschaft", June 1980, page 46–61.

The layer thickness of the foil(s) used as substrate material is preferably between 5 and 110 μm in the case of metal or alloy foils. Layer thicknesses of between 10 to 50 μm have been found to be still more advantageous.

In one advantageous embodiment of the laminates according to the invention, the layer(s) of heat-sealable high-temperature adhesive contain(s) a fibrous material. This material performs a reinforcing function. Suitable fibrous materials are, in particular, temperature-stable glass fibers (sodium-aluminium silicate fibers), aramide fibers (fibers of aromatic polyamides), carbon fibers and/or silica ($SiO_2 \cdot nH_2O$) fibers. The fibers are preferably present as fabrics woven from end-less filaments. However, the fibrs may also be used in the form of nonwoven structures or in the form of loose staple fibers.

It is of course only possible or sensible to use reinforcing fibers above a minimum ratio of polyimide layer thickness to fiber or fabric diameter. Furthermore, it has been found that laminates the polyimide and/or adhesive layer of which contain(s) particles of polytetrafluorethylene (PTFE) are still more suitable for some uses, the PTFE particles acting as a reinforcing medium and/or improving the electrical, i.e., insulating properties.

The laminates according to the invention may be produced by the process comprising:

(a) applying a coating of polyamide acid solution to a substrate layer without a coupling layer, said polyamide acid solution being formed by reacting an aromatic tetracarboxylic acid or its dianhydride and a primary aromatic diamine, in a molar ratio of from 0.95:1 to 1.05:1 in a polar solvent, to form a solution of a polyamide acid corresponding to the following formula:

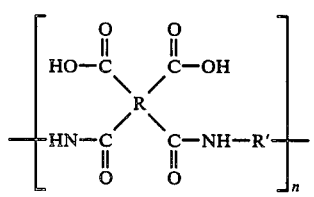

wherein R is an aromatic tetrafunctional group, R' is a difunctional aromatic group and the value of n is sufficient to obtain a polyamide acid having an $\eta_{red}$- value of at least 0.5;

(b) heating the coated substrate layer;

(c) removing said solvent in situ from the polyamide acid solution coated on said substrate layer in a first stage to form a film, said first stage being at a temperature of from 100° to 200° C., wherein virtually the entire quantity of solvent is removed;

(d) hardening the film in situ in a second stage, said second stage being at a temperature above 200° C. to give a no longer formable polyimide, said polyimide layer being insoluble in phenolic solvents, and wherein at least 95% of said polyamide acid is reacted to polyimide; and (e) applying a heat-sealable high-temperature adhesive selected from the group consisting of polyacrylates, polysulfone resins, epoxy resins, fluoropolymer resins, silicone resins and butyl rubbers to said polyimide layer to produce a basic element, said heat-sealable adhesive applied to that side of said polyimide layer which is remote from the substrate material.

Accordingly, the first step of the process comprises producing single clads from a substrate material and a no longer formable, fully aromatic polyimide directly joined to the substrate material.

This first step of the process will now be described.

The polyamide acid is produced by reaction of an aromatic tetracarboxylic acid, preferably pyromellitic acid, or preferably its dianhydride, pyromellitic acid dianhydride (PMDA), with a primary aromatic diamine, preferably 4,4'-diaminodiphenyl ether (DADE), in a solvent, for example dimethyl acetamide (DMAc). The single clad is obtained by applying a film of the polyamide acid solution to a substrate material, such as a metal foil or a polymer material or a sheet-form fibrous material, and hardening the film in situ by heat treatment in at least two stages, so that a single clad is obtained of which the polyimide layer adheres firmly to the above-mentioned substrate material, without requiring an intermediate layer of adhesive to join the polyimide film to the substrate.

The single clad may be a sheet-form structure i.e. a flexible polyimide layer which adheres to a foil of copper or other metal, for example aluminium, nickel, or steel, or an alloy containing one or more of these metals as an essential constituent or to a foil of amorphous metal. In all cases, the polyimide layer adheres firmly to the substrate and has peel strength of 4.0 N/cm and higher.

Materials of metals or synthetic polymers for example may be used as the substrate. The metals do not have to be used as elements in pure form, i.e. it is also possible in particular to use substrates of metal alloys, such as alloys containing nickel, chromium or iron or nickel and copper or of amorphous alloys containing iron. Particularly suitable substrate materials are foils of rolled, tempered copper or of a rolled, tempered copper alloy. In many cases, it has proven to be advantageous to pretreat the substrate material before coating. This pretreatment may consist of a chemical treatment, for example with an acidic salt solution, or of a mechanical roughening treatment. It has been found that this pretreatment enables the adhesion of the polyimide layer and, hence, the peel strength to be further increased. Apart from roughening the surface, the chemical pretreatment may lead to the formation of metal oxide groups on the surface of the substrate material to be coated, thus enabling the increased adhesion of a metallic substrate material to the polyimide layer. It has proven to be favorable to carry out the pretreatment in such a way that a center-line average height ($R_a$) of at least 0.2 $\mu$m is obtained.

In one embodiment of the invention, the single clads are obtained by reacting a primary aromatic diamine with an aromatic tetracarboxylic acid or its dianhydride in an extruder under conditions which lead to the formation of a solution of polyamide acid in a solvent. A layer of polyamide acid solution may then be extruded directly onto the substrate, after which time most of the solvent may be removed in situ from the polyamide acid layer in a first heating zone and the polyamide acid layer subsequently hardened in situ by another heat treatment in at least one second heating zone at a higher temperature leading to almost complete imidization. Instead of applying the polyamide acid solution to the substrate material by extrusion, it may also be applied by doctoring. The subsequent heat treatment, which results in removal of the solvent and in formation of the polyimide, is the same as described above. A polyimide layer more than 10 $\mu$m thick which does not have any interruptions or defects due to bubbles produced by the combination of a skin effect and overrapid evaporation of the solvent or of the steam formed during imidization or hardening and which adheres firmly to the substrate may be obtained by a particular sequence of heat treatments.

The polyamide acid precursors used in accordance with the invention and obtained by reacting an aromatic tetracarboxylic acid or its dianhydride with a primary aromatic diamine in a polar organic solvent have the following structural formula:

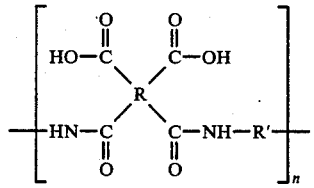

wherein R is an aromatic tetrafunctional group, R' is a difunctional aromatic group and n has a value sufficient for the formation of a polyamide acid having a reduced viscosity of 0.5 or higher, as measured on a 0.5% solution in dimethyl acetamide containing 0.1 mole/liter of lithium bromide. After application to the substrate, the polyamide acid is hardened by the described heating process, resulting in the formation of a no longer formable polyimide insoluble in phenol or phenolic solvents and having the following recurring structure

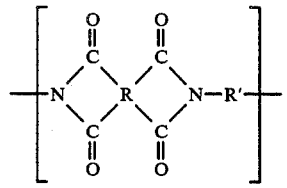

wherein R and R' represent the same groups as previously described.

Pyromellitic acid dianhydride and 4,4'-diaminodiphenyl ether are preferably used as starting materials and dimethyl acetamide as solvent in the production of the polyamide acid.

Other reactants which produce no longer formable polyimides insoluble in conventional phenolic solvents, for example phenol or substituted phenols (halogenated phenols) may also be extruded by the process according to the invention for producing the single clads.

Although dimethyl acetamide (DMAc) is preferably used as the solvent, it is also possible to use other polar organic solvents, for example N,N-dimethyl methoxy acetamide, dimethyl formamide (DMF), diethyl formamide, N-methyl-2-pyrrolidone (NMP) and dimethyl sulfoxide (DMSO). Other suitable solvents are, for example, N-methyl caprolactam, dimethyl sulfone, pyridine, hexamethyl phosphoramide, N-acetyl-2-pyrrolidone, tetramethyl urea and tetramethylene sulfone.

The polyamide acid may be produced by known methods, for example by the methods described in U.S. Pat. Nos. 3,179,614 and 3,179,634.

In the apparatus illustrated in FIG. 1, a dry mixture is prepared for example from the dianhydride (pyromellitic acid dianhydride or PMDA) and the diamine (4,4'-diaminodiphenyl ether or DADE) in a molar ratio of from 0.95:1 to 1.05:1. This mixture is delivered to a gravimetric metering unit 3. The mixture is then introduced at an accurately controlled rate into a reaction vessel 4 in the form of an extruder. A polar solvent is added by means of a metering pump 5 to the dry mixture accommodated in the extruder 4. The molecular weight of the polyamide acid is determined by the molar ratio of dianhydride to diamine. The optimal molecular weight range of the polyamide acid is reached at a molar ratio of from 0.98 to 1.02 and is measured as the reduced viscosity ($\eta_{red}$) of a 0.5% solution in dimethyl acetamide containing 0.1 mole/liter of lithium bromide. The reduced viscosity of the polyamide acid is of the order of 0.5 for molar ratios of PMDA to DADE of from 0.95 to 1.05 and is in the range from about 1.0 to 4.0 at the optimal ratio (PMDA:DADE 0.98:1 to 1.02:1). The average molecular weight of the polyamide acid formed was 32,000 for a molar ratio of 0.95, approximately 200,000 for a molar ratio of 1.0 and approximately 35,000 for a molar ratio of 1.03 (as determined with a FIKA light scattering photometer, model PGD 42,000, at $\lambda=436$ nm).

The temperature in the extruder 4 should be kept at a level below about 80° C. In practice, however, it may be gradually increased, starting from about 20° C., or raised to at most 80° C. in zones of increasing temperature. The solvent is added in the first zone of the extruder 4. The residence time in the extruder 4 is from 1 to 5 minutes. At the end of this residence time, the reaction by which the polyamide acid is formed is over. The polyamide acid with a reduced viscosity of from 0.5 to 4.0 and preferably of more than 1.0 may be extruded through a flat die 6 onto a substrate material 7 in the form of a foil of copper or another metal or an alloy run off from a roll 8 or in the form of a synthetic film or in form of a sheet-form fibrous material.

The substrate coated with the polyamide acid solution then passes through a furnace 10, to which nitrogen is fed by means of a supply pipe 11, for 5 to 20 minutes or longer for the purpose of condensation to the polyimide. The residence time in the furnace depends on the thickness of the film because longer times are required for relatively thick films.

It has proven to be essential to control the temperatures in successive zones in the furnace. However, if the temperature is controlled within the above-mentioned range, a no longer formable, bubble-free polyimide layer showing excellent electrical and mechanical properties and adhering to the substrate with a peel strength of more than 4.0 N/cm is formed on the substrate 7 in a very short time. Beyond a purely theoretical explanation of this result, it may be assumed that it is necessary for the solvent to diffuse through the polyamide acid layer and to be released from the exposed layer surface so slowly that it does not form any bubbles which increase in size and remain trapped in the matrix of the polymer layer. Also, a large part of the solvent must be released from the exposed side of the polyamide acid layer before imidization is complete. In addition, from 80 to 90% of the imidization reaction must be completed at temperatures below about 180° C. so that the majority of the water formed during the cyclization reaction also diffuses to and is released from the surface of the layer.

Figure 2:
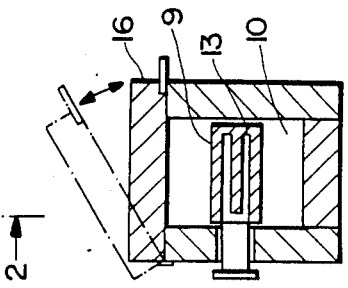
FIG. 2 is a cross-section on line 2—2 of FIG. 1, through the condensation or hardening furnace.

To achieve the objective stated above, the following heating zones are established in the condensation furnace by means of resistance elements 12, 13, 14 and 15:

In the first zone, the temperature is kept at 100° to 150° C. by an electrical resistance element 12; in the second zone, the temperature is increased to between about 130° C. and about 200° C., but preferably below 180° C.; in the third zone the temperature is increased to between about 200° and 400° C. after virtually all the solvent and the majority of the water formed during the cyclization reaction have diffused to the surface and have been removed. In the fourth zone, the temperature is again increased, preferably to between about 300° and 600° C. These heating zones are approximately equal in length, so that the residence times in the individual zones is approximately the same. However the progress rate and hence the throughput may be increased by extending the first and/or second zone(s) or by preceding the first zone with an additional heating zone kept at a temperature above 50° C., but below the temperature of the first zone. In the apparatus shown in FIG. 2, the furnace 10 may be provided with a removable cover 16 to provide easy access to the laminated element in the furnace.

In a second process step, a heat-sealable high-temperature adhesive selected from the class of acrylates, polysulfone resins, epoxy resins, fluoropolymer resins, silicone resins or butyl rubbers is applied to the layer of no longer formable polyimide, on the side remote from the substrate material. The adhesive may be applied from a solution, in which case the solvent is subsequently removed by heating. In a preferred embodiment, however, the adhesive is applied in the form of a film. After application, the film is either heat-sealed with the single clad or, alternatively, two single clads are sealed by the film to form a double clad with the following layer sequence: substrate material/polyimide/adhesive/polyimide/substrate material.

The basic elements of the flexible multilayer laminates according to the invention may be further processed in various ways. For example:

(a) Two of these basic elements, which may be the same or different, are joined at their exposed surfaces of heat-sealable high-temperature adhesive to form a double clad. This operation takes place at a temperature of from 140° C. to 500° C. and optionally under pressure. A preferred temperature range is from 180° to 450° C. The two basic elements used for this purpose may differ in the nature of the substrate material used and/or the no longer formable polyimide and/or the heat-sealable adhesive and/or in the thickness of the individual layers. Depending on the nature of the two heat-sealable adhesives and/or the process conditions (temperature, pressure), the end products obtained are double clads, in which two defined layers of heat-sealable adhesives can still be detected, or double clads in which the originally separate layers of heat-sealable adhesives have merged to form a single, defined layer. In this variant of the process, therefore, the heat-sealable high-temperature adhesive is applied to both the layers to be joined.

(b) One of the basic elements is joined to a single clad obtained by the first process step, i.e. consisting solely of substrate material and no longer formable polyimide. In this case, the layer of heat-sealable adhesive of the basic element of the laminates according to the invention is joined to the layer of no longer formable polyimide of the single clad, again at the temperatures mentioned in (a) and optionally under pressure. The products formed correspond to those mentioned as the second alternative in (a) (single-defined layer of heat-sealable adhesive). In this variant of the process, therefore, the layer of heat-sealable adhesive is applied to only one of the layers to be joined.

(c) Starting out from the basic element of the laminates or from products obtained by the process variants described above, other layers may optionally be applied to the exposed outer surfaces to obtain multiclads.

The basic element is joined to other layers at a temperature at which the heat-sealable high-temperature adhesive is formable. Depending on the nature of the layers to be joined, the nature of the heat-sealable adhesive and the desired properties of the laminate, joining may be carried out by applying a light or relatively heavy pressure. The adhesive may optionally be applied before the polyimide has fully hardened. In some cases, the adhesion of the polyimide to the adhesive can be improved in this way. The polyimide may then be hardened to its no longer formable state.

After the above-described process steps leading to the basic element of the laminates according to the invention, further layers may be applied if desired. In another embodiment of the process, it is possible to produce laminates of the type described above in which both sides of one or both layers of substrate material are directly joined to no longer formable polyimide. To this end, a single clad of substrate material and polyimide is produced and the polyimide completely cured in the first step of the process as described above. Thereafter, the second side of the substrate material is coated with a polyimide and the solvent evaporated. Complete curing may then be carried out directly or, alternatively, the heat-sealable adhesive may be applied before complete curing.

The further procedure may then be, as described above, to obtain further embodiments of the laminates. The laminates obtained in this embodiment thus have the following layer sequence: no longer formable polyimide/substrate material/no longer formable polyimide/heat-sealable high-temperature adhesive, optionally followed by further layers.

The invention is illustrated by the following Examples.

EXAMPLES 1 TO 3

These Examples illustrate the first step of the process leading to single clads which may be further processed to the laminates according to the invention by the process variants described in the following Examples.

EXAMPLE 1

A dry mixture of pyromellitic acid dianhydride (PMDA) and 4,4'-diaminodiphenyl ether (DADE) was prepared in a standard commerical powder mixer. In all, 5.0 kg of PMDA and 4.54 kg of DADE (molar ratio of PMDA to DADE 1.01) were weighed into the mixer and then mixed for 48 hours at the highest speed setting. Approximately 1.6 kg of the mixture were then introduced into a gravimetric metering unit which delivered the mixture to a negative-feed twin-screw extruder at a rate of approximately 200 g/h. DMAc was introduced into the first extruder zone kept at 20° C. at a rate of approximately 430 g/h, so that a solids concentration of 31.7% by weight was obtained. During the remaining residence time in the extruder, the temperature was increased in successive zones to 50° C. A polyamide acid having a reduced viscosity of 1.67 was obtained, being extruded from the extruder barrel through a die for thin films. The die orifice had a rectangular cross-section measuring 200×0.35 mm. The pressure at the die head was 85 bar. The polyamide acid solution was extruded onto a 35 μm thick sheet of rolled, tempered copper foil (Oak F-111), after which the laminate was introduced under nitrogen into a furnace having four equally long temperature zones of 140° C., 180° C., 350° C. and 400° C. respectively. The total residence time of the laminate was 10 minutes. During this time, the polyamide acid was reacted almost completely into the polyimide. The polyimide film adhered firmly to the copper substrate and was free from bubbles and interruptions.

The above-mentioned Oak F-111 copper foil is a product of Oak Materials Group Inc., USA, which meets the requirements of IPC-CF 150 E.

EXAMPLE 2

A second 1.6-kg sample of the mixture was subjected to the same treatment as in Example 1, except that on this occasion a 70 μm thick copper foil (Oak F-111) was used as the substrate. The polyimide film adhered firmly to the copper foil and was free from bubbles and interruptions. The properties of the laminates of Examples 1 and 2 are shown in Table 1.

TABLE 1

|  | Example 1 | Example 2 | Text method |
| --- | --- | --- | --- |
| Property (polyimide layer) | | | |
| Electric strength, KV/10$^{-3}$ inch at 60 Hz | 4.4 | 4.35 | ASTM D-149 |
| Dielectric constant at 1 kHz/25° C. | 4.0 | 3.9 | ASTM D-150 |
| Dielectric loss factor at 1 kHz/25° C. | 0.0047 | 0.0039 | ASTM D-150 |
| Tensile strength, N/mm$^2$ | 105 | 110 | ASTM D882 |
| Breaking elongation, % | 45 | 31 | ASTM D882 |
| Density, g/cm$^3$ | 1.42 | 1.42 | ASTM D1505 |
| Thickness, μm | 66 | 66 | ASTM D374 |
| LOI | 40 | 40 | ASTM D2863 |
| Property (laminate) | | | |
| Peel strength, N/cm | 8.2 | 4.8 | IPC TM 650 2.4.9 |
| Behavior on soldering without further pretreatment | no bubble | no bubble | IPC TM 650 |

TABLE 1-continued

| | Example 1 | Example 2 | Text method |
|---|---|---|---|
| | formation, no separation | formation, no separation | 2.4.13 (slightly modified) |

EXAMPLE 3

A three-necked flask was charged with 8.17 g of PMDA to which 7.58 g of DADE dissolved in 60 g of DMAc was added. The DADE had been dissolved beforehand in DMAc with continuous stirring at full speed. The molar ratio of PMDA to DADE was 0.99:1.00. Another 29.25 g of the DMAc which had been previously used for flushing out the flask and in which DADE was dissolved were then introduced into the reaction vessel. The reaction was continued with stirring for 80 minutes under nitrogen at a temperature of 22° C. Part of the polyamide acid solution formed was cast onto a 23 μm thick nickel-chrome foil (Inconel, a product of the Somers Thin-Strip/Brass Group, Olin Corp. Waterbury, Conn.) which had been previously etched with an iron (III) chloride solution of 30 g FeCl$_3$, 60 cc of 12N HCl and 180 cc of water. The Inconel foil consisted of an alloy containing nickel as its principal constituent, chromium and iron. The polyamide acid solution thus applied was drawn out to a thickness of 356 μm by means of a glass rod onto which copper wire 356 μm in diameter had been wound. The alloy foil was applied to a glass plate and attached by adhesive tape. The film was dried for 20 minutes at 70° C. and then treated under a reduced pressure of approximately 2 mm Hg at 160° C. This treatment was carried out under nitrogen in a vacuum dryer. The temperature of the dryer was then increased to 310° C. over a period of 4.5 hours. By the time the film had reached a temperature of 160° C., which took about 1-2 minutes, most of the solvent had already been driven out, as could be seen from the color of the film, a clear light yellow. The hardened, dry film was 25 μm thick.

In addition, a polyamide acid sample obtained in accordance with Example 1 was diluted with DMAc to 22% by weight of polyamide acid and a reduced viscosity ($\eta_{red}$) of 1.22, cast onto a 58 μm thick machine-scrubbed, i.e. roughened, alloy foil of a copper-nickel alloy containing approximately 70% Cu and approximately 30% Ni (Cupro-Nickel 30 # 715, a product of Somers Thin-Strip/Brass Group, Olin Corp. Waterbury, Conn.) and spread by doctoring to a wet film thickness of 356 μm. The film thus applied was also dried and hardened by the method described in this Example. Both films had an extremely high peel strength, whereas a similar film sample on a bright untreated alloy foil was easy to peel off (peel strength 0.7N/cm). Neither the polyimide layer on the etched foil nor the polyimide layer on the machine-scrubbed foil could be separated without damage to the polyimide film for the purpose of measuring peel strength. After treatment for 7 days at 260° C., the polyimide film on the machine-scrubbed foil showed excellent adhesion and flexibility.

EXAMPLE 4

Two 10×20 cm large single clads of 35 μm thick brass-clad copper foil (Gould) and polyimide of PMDA and DADE were laminated by means of a commercial 50 μm thick polyacrylate adhesive film, the layer sequence being as follows: copper foil, polyimide, adhesive film, polyimide, copper foil. For lamination, the layers were initially cold-pressed in a plate press under a pressure of 50 kp/cm$^2$, after which the foil stack was heated for 1 hour to 200° C. under that pressure, kept under these conditions for 1 hour and then cooled under pressure.

The two single clads were satisfactorily bonded into a double clad.

The properties of the double clad are shown in Table 2 which, for each property, shows three values obtained from three tests:

TABLE 2

| Total layer thickness (μm) | Dielectric constant | Dielectric loss factor (× 10$^3$) |
|---|---|---|
| 98/97/98 | 3.7/3.8/3.9 | 37.2/41.6/45.5 |

The tests were repeated using a polyacrylate film in which a fabric had been embedded. The values obtained are shown in Table 3:

TABLE 3

| SAMPLE | Total layer thickness (μm) | Dielectric constant | Dielectric loss factor (× 10$^3$) |
|---|---|---|---|
| (a) Double clad | 160/163 | 3.8/3.9 | 29/30 |
| (b) Adhesive film alone (comparison) | 115/115 | 5.1/5.6 | 95/117 |
| (c) Comparison* | 120/112/112 | 5.9/5.4/5.0 | 67.5/72.7/63.3 |

*Adhesive film laminated directly (without polyimide) between two copper foils.

The film used in this example was a polyacrylate film in which a glass fiber web was embedded, the individual fibers of which were approximately 5 μm thick. The film was obtained from Brand Rex Company USA.

The results show that clads in which a layer of acrylate is directly joined to copper (case c) are clearly inferior in their electrical properties to the laminates according to the invention (case a) in which a polyimide layer is present between the acrylate and the copper.

EXAMPLE 5

Two 10×20 cm large single clads having the same specification as in Example 4 were dried for 2 hours at 200° C. in a nitrogen atmosphere and then laminated in a plate press using a 100 μm thick intermediate adhesive film (Hostaflon$^R$-TFA, a fluoropolymer manufactured by Hoechst, Frankfurt). The polyimide layers of the single clads were in contact with the adhesive film. The laminating conditions are shown in Table 4.

TABLE 4

| Laminating time | Temperature | Pressure |
|---|---|---|
| 1h | 340° C. | 20-30 kp/cm$^2$ |
| 1h | 370° C. | 30-60 kp/cm$^2$ |

In the sample laminated at 340° C., the average peel strength of the double clads was 7.0N/cm between polyimide and Hostaflon$^R$ and 6.0N/cm between polyimide and copper. The dielectric loss factor of clads approximately 75 μm thick (three samples produced by the above method) was $14.0 \times 10^{-3}$, $16.2 \times 10^{-3}$ and $16.6 \times 10^{-3}$ and the corresponding dielectric constants of 2.8, 2.9 and 2.8 respectively.

The abbreviations used in the preceding Examples have the following meanings:
PMDA=pyromellitic acid dianhydride
DADE=4,4'-diaminodiphenyl ether
DMAc=N,N-dimethyl acetamide.

What is claimed is:

1. A flexible multilayer laminate comprising
   (a) at least one layer of a substrate material, said substrate layer having at least a first side and a second side;
   (b) at least one first layer of no longer formable, fully aromatic polyimide having a first side directly joined to said first side of said substrate layer with a peel strength of at least 4.0N/cm, said first polyimide layer being insoluble in phenolic solvents, having a tensile strength of from 100 to 150N/mm², having a breaking elongation of from 15 to 100% and having a dielectric dissipation factor of from $1.5 \times 10^{-3}$ to $5 \times 10^{-3}$ at 1 KHz, said first polyimide layer having a second side remote from said substrate layer; and
   (c) a layer of heat-sealable high-temperature adhesive selected from the group consisting of polyacrylates, polysulfone resins, epoxy resins, fluoropolymer resins, silicone resins and butyl rubbers, said adhesive layer being joined to said second side of said first polyimide layer;
said laminate being produced by the process comprising:
   (1) applying a polyamide acid solution to a first side of a substrate layer without a coupling layer to form a coated substrate layer, said polyamide acid solution being formed by reacting an aromatic tetracarboxylic acid or its dianhydride with a primary aromatic diamine in a molar ratio of from 0.95:1 to 1.05:1 in a polar solvent, to form a solution of a polyamide acid corresponding to the following formula:

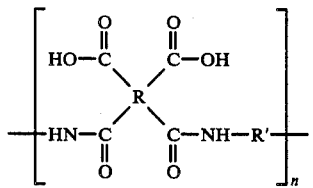

wherein R is an aromatic tetrafunctional group, R' is a difunctional aromatic group and the value of n is sufficient to obtain a polyamide acid having an $\eta_{red}$-value of at least 0.5;
   (2) heating said coated substrate layer;
   (3) removing virtually all of the solvent in situ from said polyamide acid solution on said substrate layer in a first stage to form a film, said first stage being carried out at a temperature of from 100° to 200° C.;
   (4) hardening the film in situ in a second stage, said second stage being carried out at a temperature above 200° C. to give a no longer formable polyimide layer which is insoluble in phenolic solvents, and wherein at least 95% of said polyamide acid is reacted to a polyimide; and
   (5) applying to said polyimide layer a heat-sealable high-temperature adhesive selected from the group consisting of polyacrylates, polysulfone resins, epoxy resins, fluoropolymer resins, silicone resins and butyl rubbers to produce a basic element.

2. A laminate according to claim 1, wherein at least two said basic elements are bonded to one another at a temperature in the range of from 140° to 500° C., said basic elements being bonded together on an exposed side of said high-temperature adhesive.

3. A laminate according to claim 1, wherein said substrate layer comprises a metal material selected from the group consisting of a foil of copper, nickel, aluminum, an alloy which contains one or more of these metals as an essential constituent, a foil of amorphous metal and a foil of steel.

4. A laminate according to claim 1, wherein said high-temperature adhesive is in the form of a film.

5. A process for producing a flexible multilayer laminate, comprising:
   (a) forming a polyamide acid solution by reacting an aromatic tetracarboxylic acid or its dianhydride with a primary aromatic diamine in a molar ratio of from 0.95:1 to 1.05:1 in a polar solvent to form a solution of a polyamide acid corresponding to the following formula:

$$\left[ \begin{array}{c} \text{HO-C} \quad \text{C-OH} \\ \diagdown \diagup \\ R \\ \diagup \diagdown \\ \text{HN-C} \quad \text{C-NH-R'} \\ \parallel \quad \parallel \\ O \quad O \end{array} \right]_n$$

wherein R is an aromatic tetrafunctional group, R' is a difunctional aromatic group and the value of n is sufficient to obtain a polyamide acid having an $\eta_{red}$-value of at least 0.5;
   (b) applying a coating of said polyamide acid solution to a first side of a layer of substrate material without a coupling layer;
   (c) having said coated substrate layer;
   (d) removing virtually all of said solvent in situ from the polyamide acid solution coated on said substrate layer in a first stage to form a film, said first stage being carried out at a temperature of from 100° to 200° C.;
   (e) hardening the film in situ in a second stage, said second stage being carried out at a temperature above 200° C. to give a no longer formable polyimide layer which is insoluble in phenolic solvents, and wherein at least 95% of said polyamide acid is reacted to polyimide; and
   (f) applying a heat-sealable high-temperature adhesive selected from the group consisting of polyacrylates, polysulfone resins, epoxy resins, fluoropolymer resins, silicone resins and butyl rubbers to said polyimide layer to produce a basic element.

6. A process according to claim 5, wherein at least two said basic elements are bonded to one another at a temperature in the range from 140° to 500° C., said basic elements being bonded together on an exposed side of said high-temperature adhesive.

7. A process according to claim 5, wherein said coated substrate layer is passed continuously through at least two heating zones with increasing temperature.

8. A process according to claim 5, wherein the reaction of said aromatic tetracarboxylic acid or its dianhydride with the aromatic diamine is carried out in an extruder.

9. A process according to claim 5, wherein the polyamide acid solution is continuously metered by a combined mixing and feeding unit and extruded through a shaped opening onto said substrate layer.

10. A process according to claim 5, wherein the polyamide acid solution is applied to the substrate material by doctoring.

11. A process according to claim 5, wherein said film is heated to a temperature of from 300° to 600° C. in said second stage.

12. A process according to claim 5, wherein the polar solvent is an aprotic solvent.

13. A process according to claim 12, wherein the aprotic solvent is selected from the group consisting of dimethyl acetamide, dimethyl formamide, N-methyl-2-pyrrolidone and dimethyl sulfoxide.

14. A process according to claim 5, wherein said substrate layer is selected from the group consisting of a foil of a metal or metal alloy, a polymer film and a sheet-form fibrous material.

15. A process according to claim 14, wherein said substrate layer comprises a metal material selected from the group consisting of a foil of copper, nickel, aluminum, an alloy which contains one or more of these metals as an essential constituent, a foil of amorphous metal and a foil of steel.

16. A process according to claim 15, wherein said substrate layer comprises a foil selected from the group consisting of a rolled, tempered copper and a rolled, tempered copper alloy.

17. A process according to claim 15, wherein a surface of said substrate layer to be coated with the polyamide acid solution is roughened or etched by at least one of mechanical and chemical treatment prior to coating said substrate.

18. A process according to claim 17, wherein said pretreatment is carried out in such a way that the surface of said substrate layer has a center-line average height of at least 0.20 $\mu$m after the pretreatment.

19. A process according to claim 6, wherein said high-temperature adhesive is in the form of a film.

* * * * *

UNITED STATES PATENT AND TRADEMARK OFFICE
CERTIFICATE OF CORRECTION

PATENT NO. : 4,705,720

DATED : November 10, 1987

INVENTOR(S) : Ernst F. KUNDINGER et al

It is certified that error appears in the above-identified patent and that said Letters Patent is hereby corrected as shown below:

Column 1, line 53, change "3,882,175." to --3,822,175.--.

Column 6, line 45, change "4amino-" to --4-amino---.

Column 7, line 61, change "glass fibers" to --glass fibers,--.

Column 8, line 16, change "page" to --pages--;

line 30, change "fibrs" to --fibers--.

Signed and Sealed this

Seventeenth Day of May, 1988

Attest:

DONALD J. QUIGG

Attesting Officer

Commissioner of Patents and Trademarks